US007297992B1

United States Patent
U'Ren

(10) Patent No.: US 7,297,992 B1
(45) Date of Patent: Nov. 20, 2007

(54) METHOD AND STRUCTURE FOR INTEGRATION OF PHOSPHOROUS EMITTER IN AN NPN DEVICE IN A BICMOS PROCESS

(75) Inventor: Greg D. U'Ren, Corona del Mar, CA (US)

(73) Assignee: Newport Fab, LLC, Newport Beach, CA (US)

( * ) Notice: Subject to any disclaimer, the term of this patent is extended or adjusted under 35 U.S.C. 154(b) by 50 days.

(21) Appl. No.: 10/997,534

(22) Filed: Nov. 23, 2004

(51) Int. Cl.
    *H01L 29/739* (2006.01)
(52) U.S. Cl. .............. 257/197; 257/198; 257/E21.372; 257/E29.188; 438/310; 438/312
(58) Field of Classification Search .............. 257/197, 257/565, 588, 592, 555, 199, E21.372, E29.188, 257/198; 438/311, 322, 547, 309, 312, 310, 438/317
    See application file for complete search history.

(56) References Cited

U.S. PATENT DOCUMENTS 5,164,797 A * 11/1992 Thornton ................. 372/45.01
6,437,376 B1 * 8/2002 Ozkan ........................ 257/197
6,593,640 B1 * 7/2003 Kalnitsky et al. ........... 257/565
2003/0080394 A1 * 5/2003 Babcock et al. ............ 257/555

* cited by examiner

*Primary Examiner*—Minh-Loan Tran
(74) *Attorney, Agent, or Firm*—Farjami & Farjami LLP

(57) ABSTRACT

According to one exemplary embodiment, a heterojunction bipolar transistor includes a base situated on a substrate. The heterojunction bipolar transistor can be an NPN silicon-germanium heterojunction bipolar transistor, for example. The heterojunction bipolar transistor further includes a cap layer situated on the base, where the cap layer includes a barrier region. The barrier region can comprises carbon and has a thickness, where the thickness of the barrier region determines a depth of an emitter-junction of the heterojunction bipolar transistor. An increase in the thickness of the barrier region can cause a decrease in the depth of the emitter-base junction. According to this exemplary embodiment, the heterojunction bipolar transistor further includes an emitter situated over the cap layer, where the emitter comprises an emitter dopant, which can be phosphorus. A diffusion retardant in the barrier region of the cap layer impedes diffusion of the emitter dopant.

6 Claims, 3 Drawing Sheets

METHOD AND STRUCTURE FOR INTEGRATION OF PHOSPHOROUS EMITTER IN AN NPN DEVICE IN A BICMOS PROCESS

BACKGROUND OF THE INVENTION

1. Field of the Invention

The present invention is generally in the field of fabrication of semiconductor devices. More specifically, the invention is in the field of fabrication of bipolar transistors.

2. Related Art

As Bipolar Complementary-Metal-Oxide-Semiconductor ("BiCMOS") technology continues to advance in an effort to achieve increased device speed and reduced power consumption, it becomes more difficult to transparently integrate high performance bipolar devices, such as high performance NPN devices, with CMOS devices. High performance NPN devices, such as NPN silicon-germanium (SiGe) heterojunction bipolar transistors (HBT), require a shallow emitter-base junction and low emitter resistance while CMOS devices require a CMOS process with a low thermal budget for advanced BiCMOS technology.

By way of background, in a BiCMOS process, rapid thermal processing (RTP), which is a high temperature, fast annealing process, is typically used to activate dopants and repair implant damage in the bipolar and CMOS regions of the semiconductor die. Typically, arsenic is used as an emitter dopant for NPN devices because arsenic has a high solid solubility limit, which allows the emitter to be heavily doped with arsenic to achieve a low emitter resistance. Arsenic also has a low diffusion coefficient, which limits the diffusion of arsenic into the base during the RTP process to achieve a shallow emitter-base junction.

As bipolar and CMOS devices are scaled down in advanced BiCMOS processes, CMOS device formation requires a reduced thermal budget. However, the reduced thermal budget results in lower activation of arsenic and, consequently, increased emitter resistance, which reduces NPN device performance. An N type dopant with a lower activation temperature, such as phosphorus, could be used in place of arsenic to dope the emitter of the NPN device. However, the high diffusion coefficient of phosphorus causes phosphorus to diffuse significantly into the base region of the NPN device during RTP. As a result, phosphorus causes an undesirably deep emitter-base junction to be formed in the NPN device, which reduces performance of the NPN device.

Thus, there is a need in the art for an NPN device having low emitter resistance and a shallow emitter-base junction that can be effectively integrated with a CMOS device in a BiCMOS process.

SUMMARY OF THE INVENTION

The present invention is directed to method and structure for integrating a phosphorus emitter in an NPN device in a BiCMOS process. The present invention overcomes the need in the art for an NPN device having a low emitter resistance and a shallow emitter-base junction that can be effectively integrated with a CMOS device in a BiCMOS process.

According to one exemplary embodiment, a heterojunction bipolar transistor includes a base situated on a substrate. The heterojunction bipolar transistor can be an NPN silicon-germanium heterojunction bipolar transistor, for example. The heterojunction bipolar transistor further includes a cap layer situated on the base, where the cap layer includes a barrier region. The cap layer may be silicon, for example, and the barrier region can comprise carbon. The barrier region may have a thickness of between approximately 50.0 Angstroms and approximately 75.0 Angstroms, for example. The barrier region has a thickness, where the thickness of the barrier region determines a depth of an emitter-junction of the heterojunction bipolar transistor.

According to this exemplary embodiment, the heterojunction bipolar transistor further includes an emitter situated over the cap layer, where the emitter comprises an emitter dopant. A diffusion retardant in the barrier region of the cap layer impedes diffusion of the emitter dopant, which can be phosphorus. The diffusion retardant may have a concentration of between approximately 0.2 atomic percent and approximately 1.0 atomic percent in the barrier region, for example. In another embodiment, the present invention is a method that achieves the above-described heterojunction bipolar transistor. Other features and advantages of the present invention will become more readily apparent to those of ordinary skill in the art after reviewing the following detailed description and accompanying drawings.

DETAILED DESCRIPTION OF THE INVENTION

The present invention is directed to method and structure for integrating a phosphorus emitter in an NPN device in a BiCMOS process. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
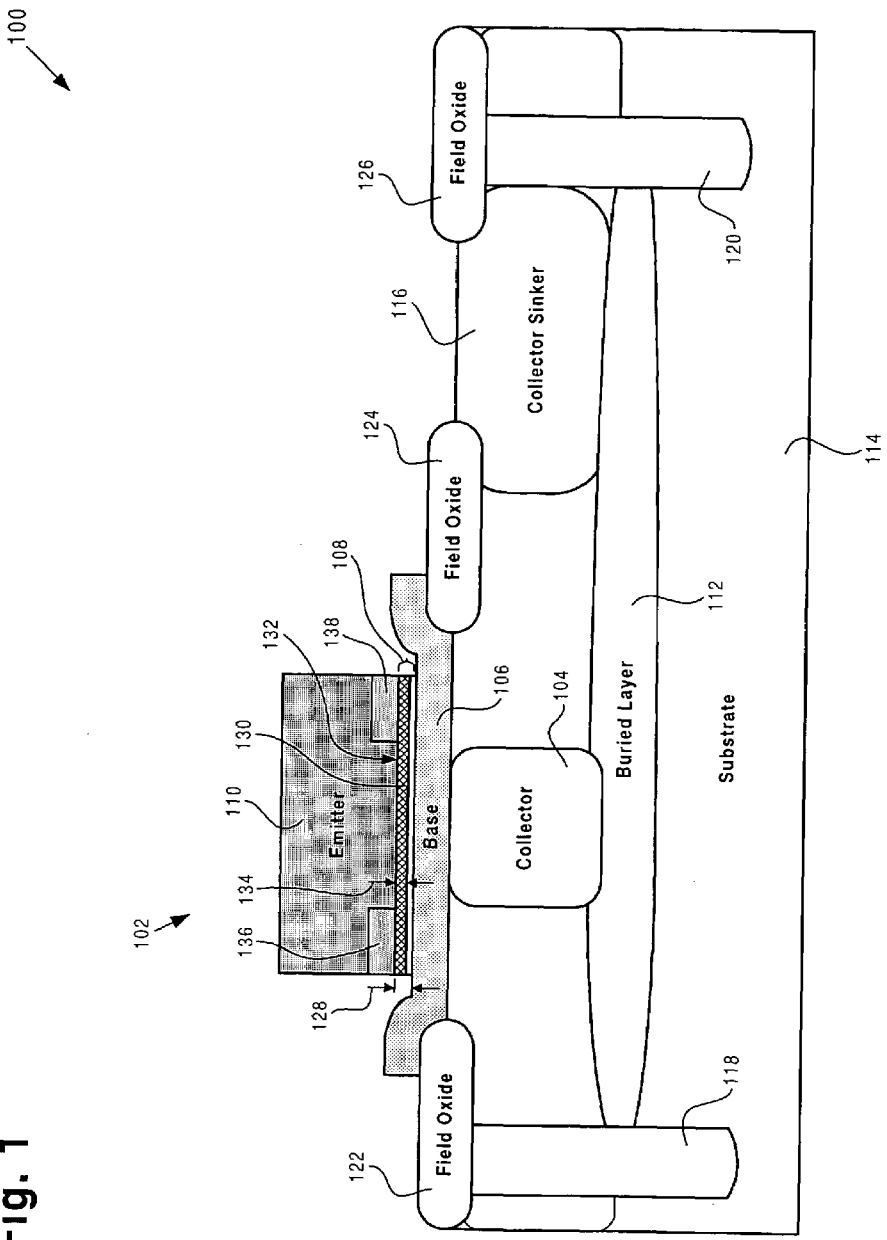
FIG. 1 illustrates an exemplary structure, including an exemplary NPN SiGe HBT, in accordance with one embodiment of the present invention.

FIG. 1 shows a cross-sectional view of structure 100, which is utilized to describe one embodiment of the present invention. Certain details and features have been left out of FIG. 1 that are apparent to a person of ordinary skill in the art. Although structure 100 illustrates an exemplary NPN SiGe HBT, the present invention manifestly applies to other similar or related structures, such as other NPN devices. Structure 100 includes NPN SiGe HBT 102, which includes collector 104, base 106, cap layer 108, and emitter 110. NPN SiGe HBT 102 can be integrated with a CMOS device (not shown in FIG. 1) in a BiCMOS process.

As shown in FIG. 1, buried layer 112, which can comprise heavily doped N type material, can be formed in substrate 114 in a manner known in the art. Also shown in FIG. 1, collector sinker 116, which can also comprise heavily doped N type material, can be formed by diffusion of a high concentration of dopants from the surface of collector sinker 116 down to buried layer 112. Buried layer 112, along with collector sinker 116, provide a low resistance electrical pathway from collector 104 through buried layer 112 and collector sinker 116 to a collector contact (not shown in FIG. 1).

Further shown in FIG. 1, deep trench structures 118 and 120 and field oxide structures 122, 124, and 126 are situated in substrate 114 and provide electrical isolation between NPN SiGe HBT 102 and other devices on substrate 114. Deep trench structures 118 and 120 and field oxide structures 122, 124, and 126 can comprise silicon oxide material and can be formed in a manner known in the art. Also shown in FIG. 1, collector 104 is situated over buried layer 112 and can be N type single crystal silicon, which might be deposited epitaxially using a chemical vapor deposition (CVD) process, a reduced pressure chemical vapor deposition (RPCVD) process, or other appropriate process.

Also shown in FIG. 1, base 106 is situated over substrate 114 and situated on top of, and forms a junction with, collector 104. Base 106 can be P type silicon-germanium single crystal, which can include a base dopant, such as boron, and might be deposited epitaxially in a "nonselective" RPCVD process or other appropriate process. Further shown in FIG. 1, cap layer 108 is situated over base 106 and can comprise single crystal silicon, which might be epitaxially deposited using a CVD process, a RPCVD process, or other appropriate process. In one embodiment, cap layer 108 can comprise silicon-germanium. By way of example, thickness 128 of cap layer 108 can be approximately 100.0 Angstroms.

As shown in FIG. 1, cap layer 108 includes barrier region 130 which, in accordance to the teachings of an embodiment of the present invention, can comprise carbon. Barrier region 130 extends from top surface 132 of cap layer 108 toward base 106 and can be formed by doping a portion of cap layer 108 with carbon. By way of example, thickness 134 of barrier region 130 can be between approximately 50.0 Angstroms and approximately 75.0 Angstroms. In one embodiment, thickness 134 of barrier region 130 can be approximately equal to thickness 128 of cap layer 108. In one embodiment, barrier region 130 can have a carbon concentration level of between approximately 0.2 atomic percent and approximately 1.0 atomic percent. In one embodiment of the present invention, barrier region 130 is formed in cap layer 108 to retard diffusion of phosphorus, which is utilized in one embodiment as an emitter dopant.

As further shown in FIG. 1, emitter 110 is situated on cap layer 108 and can comprise N type polycrystalline silicon which, according to an embodiment of the present invention, can be doped with an emitter dopant such as phosphorus. In one embodiment, emitter 110 may comprise amorphous silicon, which can be doped with phosphorus. Emitter 110 may be formed by depositing, patterning, etching, and doping a layer of polycrystalline silicon with phosphorus, i.e. an N type dopant, in a manner known in the art. By application of heat to structure 100 in a subsequent RTP process, phosphorus in emitter 110 can diffuse into base 106 to form an emitter-base junction. Also shown in FIG. 1, dielectric segments 136 and 138, which can comprise silicon oxide, provide electrical isolation between emitter 110 and base 106.

By way of background, characteristics and functionality of the present exemplary NPN SiGe HBT 102 are affected and can be tailored by varying steps of the fabrication process. In particular, it is desirable to accurately control the dopant profiles of cap layer 108 and base 106 to achieve a desired NPN HBT performance. In the present application, a dopant profile in cap layer 108 is also referred to as a concentration of a cap layer dopant, such as carbon, in cap layer 108 and a dopant profile in base 106 is also referred to as a concentration of a base dopant, such as boron, in base 106.

Figure 2:
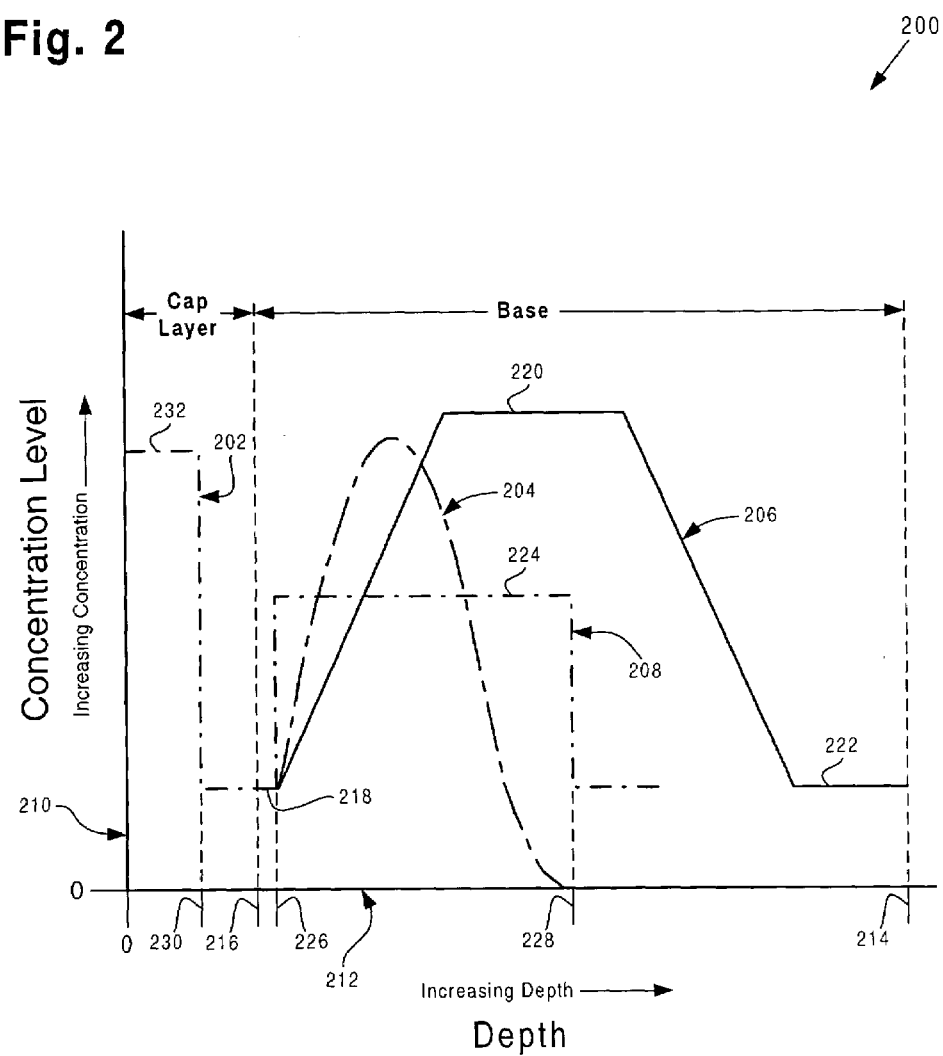
FIG. 2 is a graph showing dopant profiles in a cap layer and a base of an exemplary NPN SiGe HBT in accordance with one embodiment of the present invention.

Graph 200 in FIG. 2 shows exemplary dopant profiles in the cap layer and base of an exemplary NPN SiGe HBT in accordance with one embodiment of the present invention. In particular, carbon profile 202 in graph 200 shows a carbon profile in cap layer 108 in FIG. 1. Also, boron profile 204, germanium profile 206, and carbon profile 208, respectively, in graph 200 show boron, germanium, and carbon profiles in base 106 in FIG. 1. Graph 200 includes concentration level axis 210 plotted against depth axis 212. Concentration level axis 210 shows a relative concentration level of carbon in carbon profile 202 in cap layer 108 in FIG. 1. Concentration level axis 210 also shows relative concentration levels of boron, germanium, and carbon, respectively, in boron profile 204, germanium profile 206, and carbon profile 208 in base 106.

Depth axis 212 shows increasing depth in cap layer 108 and base 106 in FIG. 1, starting at top surface 132 of cap layer 108. Thus, "0" on depth axis 212 indicates the approximate transition from emitter 110 to cap layer 108. Additionally, depth 214 on depth axis 212 indicates the collector-base junction, i.e. the transition from base 106 to collector 104, of NPN SiGe HBT 102 in FIG. 1. Boron profile 204 shows the concentration of boron in base 106, plotted against depth, i.e. distance into base 106. It is noted that boron is used as an exemplary P type dopant in the present exemplary NPN SiGe HBT for the purpose of illustrating the present invention by way of a specific example. However, the principles of the present invention apply equally to an NPN HBT using a different P type dopant in its base and even to a PNP HBT using an N type dopant in its base.

Continuing with graph 200 in FIG. 2, germanium profile 206 shows the concentration of germanium in base 106, plotted against depth, i.e. distance into base 106. Germanium profile 206 begins at depth 216, i.e. the top surface of base 106, and it (i.e. germanium profile 206) ends at depth 214, which corresponds to the collector-base junction, i.e. the transition from base 106 to collector 104 in FIG. 1. The germanium concentration level ramps up from germanium concentration level 218 to germanium concentration level 220 and ramps down to germanium concentration level 222 in base 106. In one embodiment, the germanium concentration levels 218 and 222 may be approximately equal to 0.0 atomic percent of germanium. By way of background, increasing the concentration of germanium in a base of an NPN SiGe HBT allows an electric field to build up in the base, which produces the desirable result of increasing performance of the NPN SiGe HBT.

Continuing with graph 200, carbon profile 208 shows the concentration of carbon in base 106, plotted against depth, i.e. distance into base 106. As shown in FIG. 2, carbon profile 208 increases to carbon concentration level 224 between depth 226 and depth 228 in base 106. By way of example, carbon concentration level 224 can be approximately 0.2 atomic percent of carbon. According to embodiments of the invention, carbon is introduced into base 106 of NPN SiGe HBT 102 to retard boron diffusion, which can undesirably increase the effective base width. For example, an RTP process utilized in the fabrication of NPN SiGe HBT 102 can cause boron to diffuse into adjoining silicon regions of NPN SiGe HBT 102, which can severely degrade the performance of NPN SiGe HBT 102.

Continuing with graph 200, carbon profile 202 shows the concentration of carbon in cap layer 108, plotted against depth, i.e. distance into cap layer 108. As shown in FIG. 2, carbon profile 202 has carbon concentration level 232 between "0" on depth axis 212, i.e. top surface 132 of cap layer 108, and depth 230. By way of example, carbon concentration level 230 can be between approximately 0.2 atomic percent of carbon and approximately 1.0 atomic percent of carbon. The portion of cap layer 108 between "0" on depth axis 212 and depth 230 corresponds to barrier region 130 in FIG. 1. According to the embodiments of the invention, barrier region 130, which is doped with carbon, is formed to retard diffusion of phosphorus which, according to embodiments of the invention, is used as an N type dopant in emitter 110.

By forming barrier region 130 in cap layer 108, the present invention retards diffusion of an emitter dopant, for example phosphorus, into base 106 during a subsequent RTP process, which is used to activate emitter, base, and collector dopants in NPN SiGe HBT 102. By retarding diffusion of a dopant such as phosphorus into base 106, the present invention advantageously achieves control over the depth of the emitter-base junction, formed during the RTP process.

By way of background, the emitter-base junction of an NPN SiGe HBT is typically formed during an anneal process, such as an RTP process, where an N type emitter dopant, such as phosphorus, diffuses into the base in close proximity of a P type base dopant, such as boron. By controlling thickness 134 of barrier region 130, the present invention can control the diffusion of the emitter dopant, i.e. phosphorus, into base 106 and, consequently, control the depth of the emitter-base junction. For example, decreasing thickness 134 of barrier region 130 provides a deeper emitter-base junction while increasing thickness 134 of barrier region 130 provides a shallower emitter-base junction.

Also, by forming carbon-doped barrier region 130 in cap layer 108, the present invention can effectively utilize phosphorus as an emitter dopant in a BiCMOS process which requires a reduced thermal budget. By way of background, advanced BiCMOS processes require a reduced thermal budget with a lower RTP temperature, such as an RTP temperature of approximately 1000.0° C. or lower, to transparently and effectively integrate CMOS and NPN devices. However, at an RTP temperature of approximately 1000.0° C., a conventional emitter dopant, such as arsenic, does not completely activate, which undesirably increases emitter resistance.

Although phosphorus has high activation at an RTP temperature of approximately 1000.0° C., phosphorus also has a higher diffusion coefficient than arsenic. As a result, in a conventional fabrication process, phosphorus can diffuse deeper into the base than arsenic and, thereby, cause an undesirably deep emitter-base junction, which reduces the speed of the NPN device. However, by forming a barrier region comprising carbon in a cap layer to retard phosphorus diffusion, the present invention can utilize phosphorus as an emitter dopant to achieve a transistor with a desirably low emitter resistance and a desirably shallow emitter-base junction in an advanced BiCMOS process.

Figure 3:
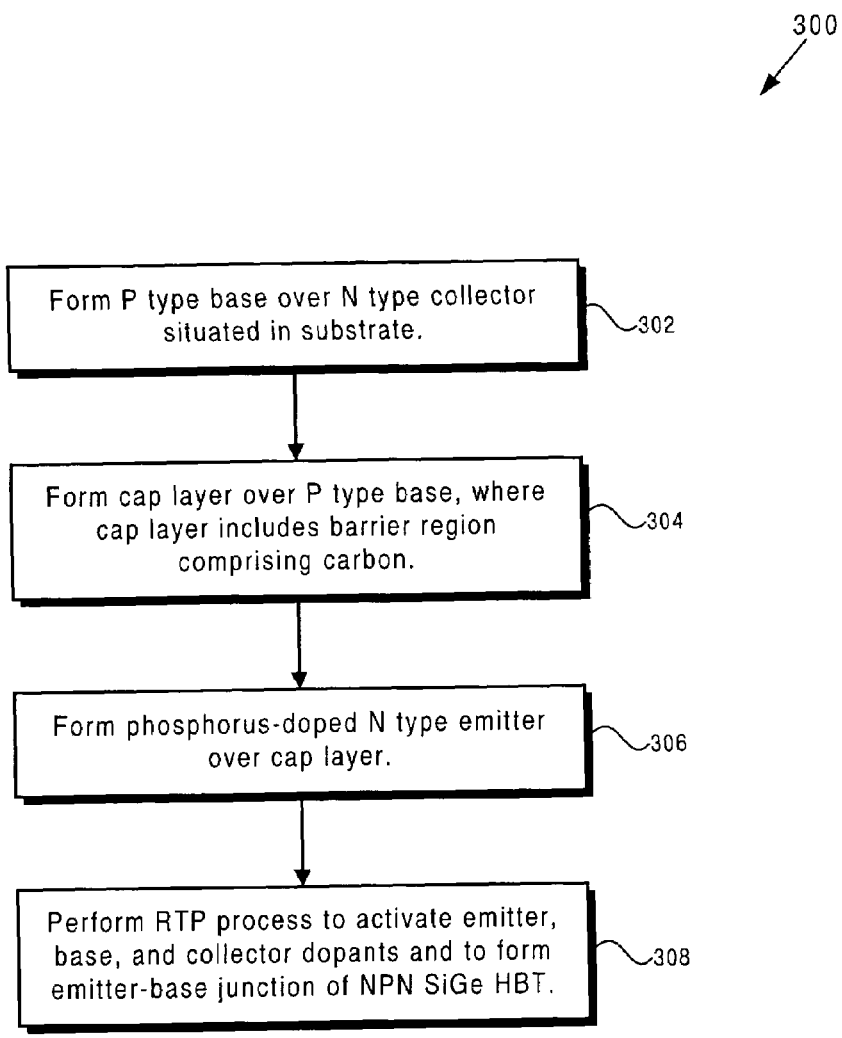
FIG. 3 shows a flowchart illustrating the steps taken to implement an embodiment of the present invention.

FIG. 3 shows flowchart 300, which describes the steps, according to one embodiment of the present invention, of a process by which the NPN SiGe HBT in structure 100 in FIG. 1 is fabricated. Certain details and features have been left out of flowchart 300 that are apparent to a person of ordinary skill in the art. For example, a step may consist of one or more substeps or may involve specialized equipment or materials, as known in the art. Steps 302 through 308 indicated in flowchart 300 are sufficient to describe one embodiment of the present invention, other embodiments of the invention may utilize steps different from those shown in flowchart 300. It is noted that the processing steps shown in flowchart 300 are performed on a wafer, which, prior to step 302, includes a silicon substrate including field a collector, a collector sinker, field oxide and deep trench structures, and a buried layer.

At step 302 in flowchart 300, a P type base, i.e. base 106, is formed over an N type collector, i.e. collector 104, in a substrate, i.e. substrate 114. Base 106 forms a junction with collector 104 and can be P type silicon-germanium single crystal, which can include a base dopant, such as boron, and might be deposited epitaxially in a "nonselective" RPCVD process or other appropriate process. Base 106 can also includes carbon, which is used to retard the diffusion of boron during a subsequent RTP process. At step 304, a cap layer, i.e. cap layer 108, which includes a barrier region, i.e. barrier region 130, is formed over the base. Cap layer 108 is situated over base 106 and can comprise single crystal silicon, which might be epitaxially deposited using a CVD process, a RPCVD process, or other appropriate process.

Barrier region 130 can be formed by doping a portion of cap layer 108 with carbon and has thickness 134. By way of example, thickness 134 can be between approximately 50.0 Angstroms and approximately 75.0 Angstroms. By way of example, barrier region 130 can have a carbon concentration level of between approximately 0.2 atomic percent and approximately 1.0 atomic percent. Barrier region 130 is formed to retard the diffusion of an emitter dopant such as phosphorus. In step 306, a phosphorus-doped N type emitter, i.e. emitter 110, is formed over the cap layer. Emitter 110 is situated on cap layer 108 and can comprise N type polycrystalline silicon, which can be doped with phosphorus. Emitter 110 may be formed by depositing, patterning, etching, and doping a layer of polycrystalline silicon with phosphorus, i.e. an N type dopant, in a manner known in the art.

In step 308, a RTP process is performed to activate emitter, base, and collector dopants and to form an emitter-base junction in, for example, NPN SiGe HBT 102. The emitter-base junction can be formed by diffusion of phosphorus into base 106 at an RTP temperature of approximately 1000.0° C., for example. Barrier region 130, which comprises carbon, retards the diffusion of phosphorus, which enables the depth of emitter-base junction to be controlled. For example, the depth of the emitter-base junction can be controlled by appropriately determining the thickness, i.e. thickness 134, of barrier region 130 and the carbon concentration in barrier region 130. For example, thickness 134 can be between approximately 50.0 Angstroms and approximately 75.0 Angstroms while the carbon concentration in barrier region 130 can be between approximately 0.2 atomic percent of carbon and approximately 1.0 atomic percent of carbon.

Thus, as discussed above, the present invention forms a barrier layer comprising a diffusion retardant, for example, carbon, in a cap layer to impede diffusion of an emitter dopant, for example, phosphorus, into the base of a transistor. As a result, the present invention effectively integrates a phosphorus emitter in a transistor, such as an NPN SiGe HBT, in an advanced BiCMOS process, to advantageously achieve a desirably low emitter resistance and a desirably shallow emitter-base junction.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. For example, the principles of the present invention are also applicable to transistors using a P type dopant other than boron, or using a diffusion retardant other than carbon. Moreover, the present invention is applicable to transistors using semiconductors other than silicon or germanium. Further, the present invention's principles can also be applied to PNP transistors, PNP HBTs, or PNP SiGe HBTs.

As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method and structure for integrating a phosphorus emitter in an NPN device in a BiCMOS process have been described.

The invention claimed is:

1. A heterojunction bipolar transistor comprising:
   a base situated over a collector, said collector being situated in a substrate;
   a cap layer situated on said base, said cap layer comprising a barrier region;
   an emitter situated over said cap layer, said emitter comprising an emitter dopant;
   wherein a diffusion retardant in said barrier region of said cap layer impedes diffusion of said emitter dopant, wherein said barrier region has a thickness, wherein said thickness of said barrier region determines a depth of an emitter-base junction of said heterojunction bipolar transistor.

2. The heterojunction bipolar transistor of claim 1 wherein an increase in said thickness of said barrier region causes a decrease in said depth of said emitter-base junction.

3. The heterojunction bipolar transistor of claim 1 wherein said diffusion retardant has a concentration of between approximately 0.2 atomic percent and approximately 1.0 atomic percent in said barrier region.

4. A method of fabricating a heterojunction bipolar transistor, said method comprising steps of:
   forming a base over a collector, said collector being situated in a substrate;
   forming a cap layer over said base, said cap layer comprising a barrier region;
   forming an emitter over said cap layer, said emitter comprising an emitter dopant;
   performing rapid thermal processing;
   wherein said barrier region of said cap layer impedes diffusion of said emitter dopant into said base during said rapid thermal processing step, wherein a diffusion retardant in said barrier region of said cap layer impedes diffusion of said emitter dopant.

5. The method of claim 4 wherein said barrier region has a thickness, wherein said thickness of said barrier region determines a depth of an emitter-base junction of said heterojunction bipolar transistor.

6. The method of claim 5 wherein an increase in said thickness of said barrier region causes a decrease in said depth of said emitter-base junction.

* * * * *